(12) United States Patent
Moribe et al.

(10) Patent No.: US 6,727,771 B2
(45) Date of Patent: Apr. 27, 2004

(54) SEMICONDUCTOR INTEGRATED CIRCUIT DEVICE WITH VARIABLE GAIN AMPLIFIER

(75) Inventors: Tsuyoshi Moribe, Kasugai (JP); Kazuyoshi Arimura, Kasugai (JP); Susumu Kato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 174 days.

(21) Appl. No.: 09/972,152

(22) Filed: Oct. 9, 2001

(65) Prior Publication Data

US 2002/0074560 A1 Jun. 20, 2002

(30) Foreign Application Priority Data

Dec. 19, 2000 (JP) .......................... 2000-385375

(51) Int. Cl.⁷ ................................ H03C 3/00
(52) U.S. Cl. ............... 332/103; 375/308; 455/326; 455/232.1; 455/333; 332/103; 332/105
(58) Field of Search ................. 332/103, 105; 455/326, 232.1, 323, 333; 375/308

(56) References Cited

U.S. PATENT DOCUMENTS 5,771,442 A * 6/1998 Wang et al. .................. 455/93
5,862,466 A * 1/1999 Erickson ..................... 455/296
6,560,449 B1 * 5/2003 Liu .............................. 455/302

FOREIGN PATENT DOCUMENTS

EP          0 572 130 A1    12/1993

* cited by examiner

*Primary Examiner*—Arnold Kinkead
(74) *Attorney, Agent, or Firm*—Arent Fox Kintner Plotkin & Kahn

(57) ABSTRACT

A semiconductor integrated circuit device includes an orthogonal modulator that maintains carrier leak characteristics regardless of attenuation of an output signal level. The orthogonal modulator includes a phase shifter circuit and generates a modulation signal. An auto gain controller amplifies the modulation signal to generate an amplified modulation signal. A gain adjusting circuit adjusts a gain of the phase shifter circuit in accordance with a control signal.

11 Claims, 7 Drawing Sheets

SEMICONDUCTOR INTEGRATED CIRCUIT DEVICE WITH VARIABLE GAIN AMPLIFIER

BACKGROUND OF THE INVENTION

The present invention relates to semiconductor integrated circuit devices with variable gain amplifiers, and, more particularly, to semiconductor integrated circuit devices that have auto gain controllers and orthogonal modulators.

To decrease power consumption and improve communication quality in a mobile communication device such as a cellular phone, a transmitting portion of the communication device must be provided with an improved orthogonal modulator.

FIG. 1 shows a prior art semiconductor integrated circuit device 50 that includes an auto gain controller (AGC) 6 and an orthogonal modulator 1. The orthogonal modulator 1 has a phase shifter circuit 2, first and second modulation mixer circuits 3, 4, and an adder 5.

The phase shifter circuit 2 receives complementary input signals LOin that have a predetermined frequency. The phase shifter circuit 2 shifts the phase of each input signal LOin at positive or negative 90 degrees to generate first and second carrier signals. The phase of the first carrier signal is thus offset from the phase of the second carrier signal at 180 degrees.

The first modulation mixer circuit 3 receives the first carrier signal and base-band signals Q, XQ. The second modulation mixer circuit 4 receives the second carrier signal and base-band signals I, XI.

The first modulation mixer circuit 3 multiplies the first carrier signal by the base-band signals Q, XQ to generate a modulation signal. The modulation signal is supplied to the adder 5. The second modulation mixer circuit 4 multiplies the second carrier signal by the base band signals I, XI to generate a modulation signal. The modulation signal is also supplied to the adder 5.

The adder 5 adds the modulation signals of the first and second modulation mixer circuits 3, 4 to generate a sum signal RFout. The adder 5 then sends the sum signal RFout to the AGC 6.

The AGC 6 includes an auto gain control circuit (AGC circuit) 7 and a gain adjusting circuit (CNT circuit) 8. The sum signal RFout is sent to the AGC circuit 7.

The CNT circuit 8 generates an AGC gain control signal Vagc in accordance with a main control signal Vcnt and sends the AGC gain control signal Vagc to the AGC circuit 7.

As shown in FIG. 3, the gain G1 of the phase shifter circuit 2 remains constant regardless of the AGC gain control signal Vagc (the main control signal Vcnt). In contrast, the gain G2 of the AGC circuit 7 varies in relation to the AGC gain control signal Vagc. Thus, the total gain G3 of the orthogonal modulator 1 and the AGC 6 varies in relation to the main control signal Vcnt. Accordingly, in the graph of FIG. 3, the line that represents the total gain G3 and the line that represents the gain G2 of the AGC 6 are inclined at equal gradients.

The AGC circuit 7 generates an output signal OUT in correspondence with the level of the main control signal Vcnt. As shown in FIG. 2, if the level of the main control signal Vcnt varies from Vcnt1 to Vcnt2, the output level Pout of the output signal OUT decreases from a maximum value Pmax to a minimum value Pmin. In other words, the output level Pout is adjusted in relation to the level of the main control signal Vcnt.

In the semiconductor integrated circuit device 50, the output signal OUT constantly includes an output frequency component of the phase shifter circuit 2 as a carrier leak CL. For example, as shown in FIG. 2, if the gain of the AGC circuit 7 decreases, the carrier leak CL is attenuated together with the output level Pout. However, as the output level Pout decreases toward the minimum level Pmin, the decrease rate of the carrier leak CL becomes smaller than that of the output level Pout. In other words, as the level of the main control signal Vcnt decreases toward the level Vcnt2, the interval between the curve that represents the carrier leak CL and the curve that represents the output level Pout becomes smaller.

As shown in FIG. 2, when the output level Pout is the maximum level Pmax, the level difference between the output signal OUT and the carrier leak CL is ΔCLa. When the output level Pout is the minimum level Pmin, the level difference between the output signal OUT and the carrier leak CL is ΔCLb. The level difference ΔCLb is smaller than the level difference ΔCLa. In other words, the level of the output frequency component (the carrier leak component) of the phase shifter circuit 2 becomes constant before the output level Pout reaches the minimum level Pmin.

Thus, the carrier leak characteristics of the semiconductor integrated circuit device 50 are changed if the output level Pout is lowered toward the minimum level Pmin in accordance with the main control signal Vcnt.

BRIEF SUMMARY OF THE INVENTION

Accordingly, it is an objective of the present invention to provide an orthogonal modulator that maintains carrier leak characteristics regardless of attenuation of an output signal level.

To achieve the foregoing and other objectives and in accordance with the purpose of the present invention, the invention provides a semiconductor integrated circuit device including an orthogonal modulator for generating a modulation signal. The orthogonal modulator includes a phase shifter circuit. An auto gain controller is connected to the orthogonal modulator for amplifying the modulation signal to generate an amplified modulation signal. A gain adjusting circuit adjusts a gain of the phase shifter circuit in accordance with a control signal.

In an embodiment of the present invention there is provided a semiconductor integrated circuit device including a phase shifter circuit for receiving a plurality of complementary input signals that have a predetermined frequency and shifting a phase of each complementary input signal to generate first and second carrier signals. A first modulation mixer circuit is connected to the phase shifter circuit to multiply the first carrier signal by a first base-band signal and generate a first modulation signal. A second modulation mixer circuit is connected to the phase shifter circuit to multiply the second carrier signal by a second base-band signal and generate a second modulation signal. An adder is connected to the first and second modulation mixer circuits to add the first and second modulation signals and generate a sum signal. A first gain adjusting circuit is connected to the phase shifter circuit to control the amplitude of each carrier signal of the phase shifter circuit in accordance with a control signal. An auto gain controller is connected to the adder to generate an amplified modulation signal from the sum signal. A second gain adjusting circuit is connected to the auto gain controller to control a gain of the auto gain controller in accordance with the control signal.

In an embodiment of the present invention there is provided a semiconductor integrated circuit device including an analog/digital converter for converting an analog control signal to a digital control signal. First and second phase shifter circuits are connected to the analog/digital converter to receive the digital control signal and a complementary input signal that has a predetermined frequency. Either the first or second phase shifter circuit is activated in response to the digital control signal. The first phase shifter circuit generates a carrier signal in accordance with a relatively small gain when activated. The second phase shifter circuit generates the carrier signal in accordance with a relatively large gain when activated. A quadrature modulator is connected to the first and second phase shifter circuits to generate a modulation signal from the carrier signal. An auto gain controller is connected to the quadrature modulator to amplify the modulation signal in accordance with a predetermined gain and generate an amplified modulation signal. First and second gain adjusting circuits are connected to the auto gain controller and the analog/digital converter to receive the analog control signal and the digital control signal and adjust the gain of the auto gain controller. The first or second gain adjusting circuit is selectively activated in response to the digital control signal. The first gain adjusting circuit is activated together with the first phase shifter circuit to operate the auto gain controller in accordance with a relatively high gain. The second gain adjusting circuit is activated together with the second phase shifter circuit to operate the auto gain controller in accordance with a relatively low gain.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS (First Embodiment)

Figure 1:
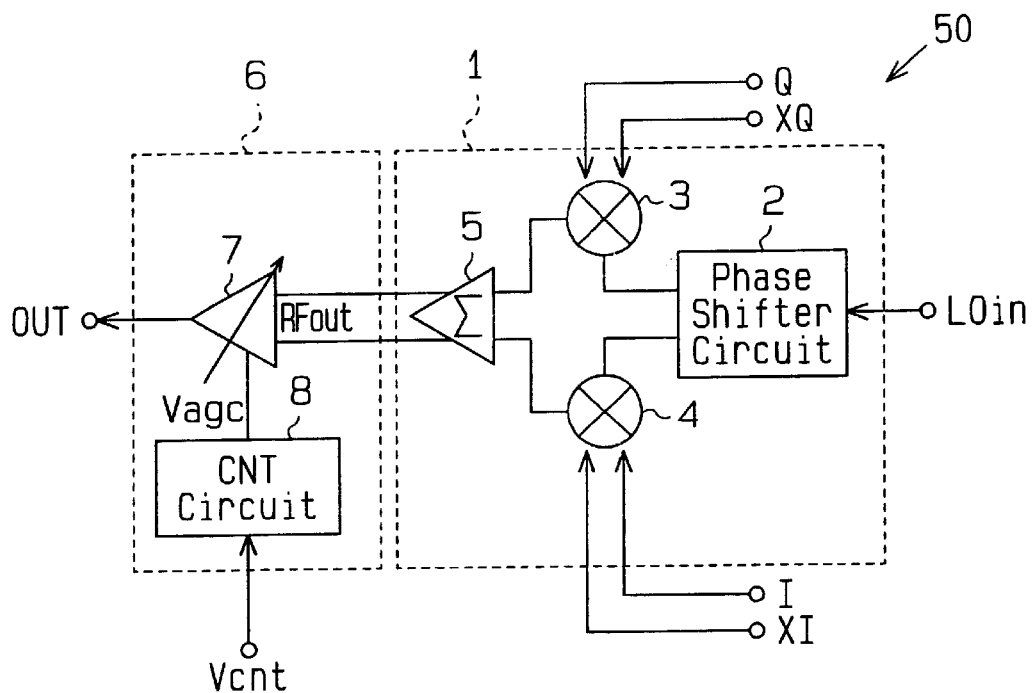
FIG. 1 is a block diagram showing a prior art semiconductor device.
Figure 2:
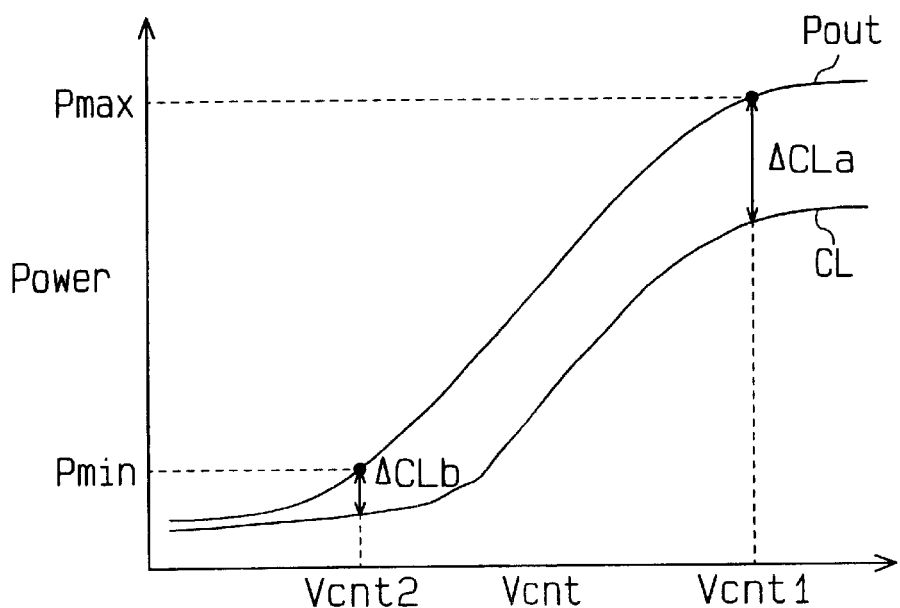
FIG. 2 is a graph indicating the level of a carrier leak and the level of an output signal of the semiconductor device of FIG. 1.
Figure 3:
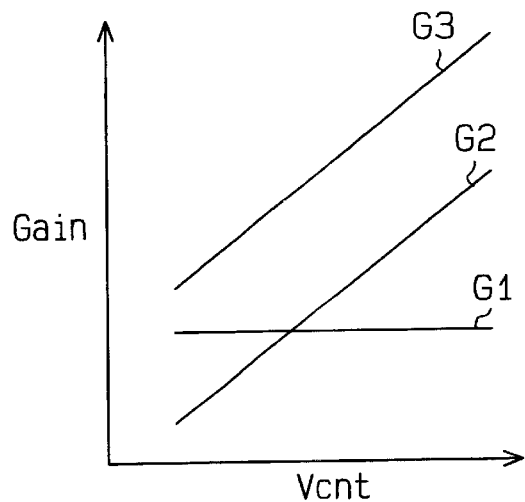
FIG. 3 is a graph indicating the relationship between the gain and a control signal of the semiconductor device of FIG. 1.
Figure 4:
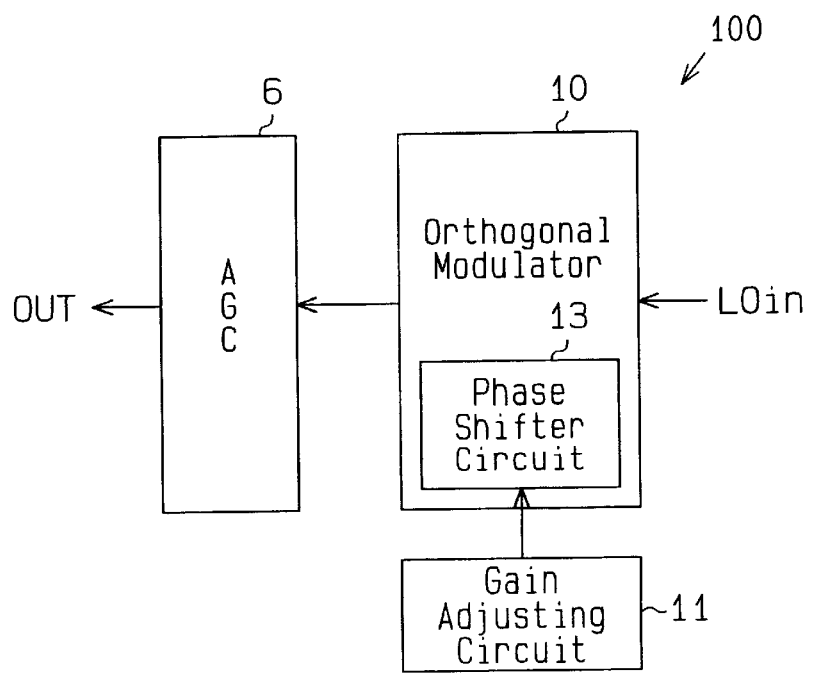
FIG. 4 is a block diagram showing a semiconductor device of a first embodiment according to the present invention.

FIG. 4 shows a semiconductor integrated circuit device 100 of a first embodiment according to the present invention. The integrated circuit device 100 includes an orthogonal modulator 10, an AGC 6, and a gain adjusting circuit 11. The orthogonal modulator 10 has a phase shifter circuit 13. The AGC 6 receives an output signal from the orthogonal modulator 10. The gain adjusting circuit 11 is connected to the orthogonal modulator 10 and adjusts the gain of the phase shifter circuit 13, or the orthogonal modulator 10. Thus, the orthogonal modulator 10 sends an output signal in accordance with the adjusted gain to the AGC 6.

(Second Embodiment)

Figure 5:
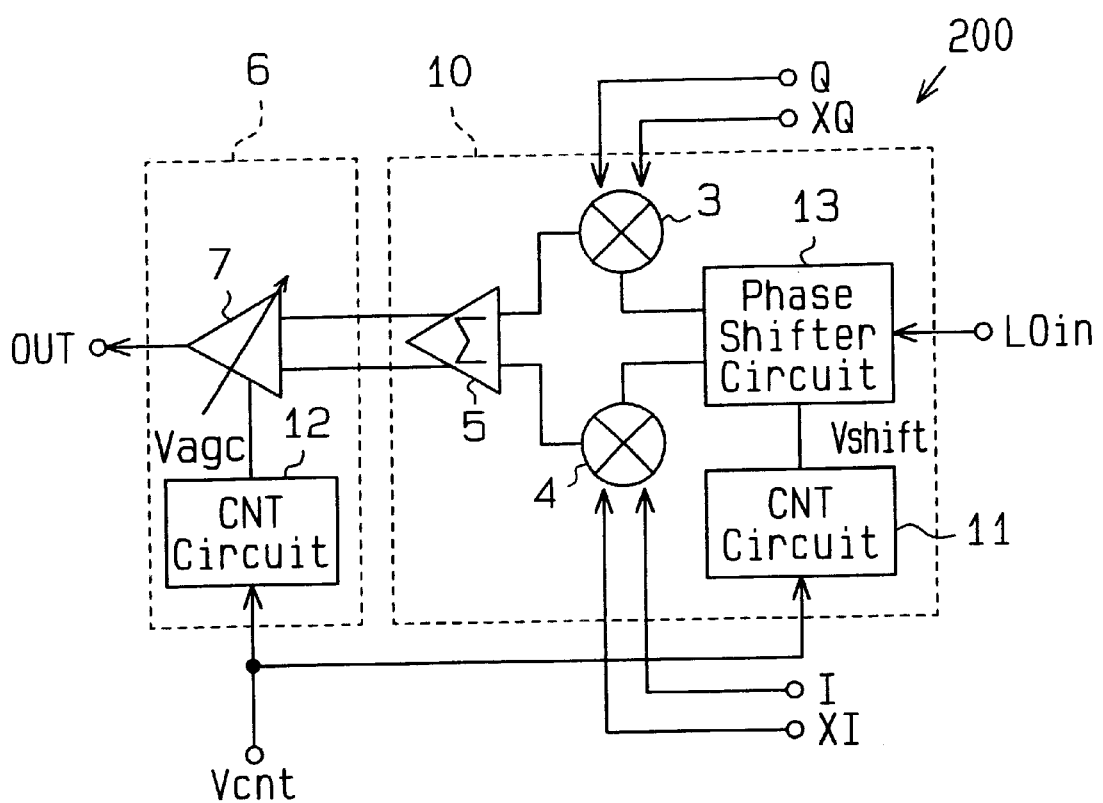
FIG. 5 is a block diagram showing a semiconductor device of a second embodiment according to the present invention.

FIG. 5 shows a semiconductor integrated circuit device 200 of a second embodiment according to the present invention. The device 200 includes an orthogonal modulator 10 and an AGC 6. The orthogonal modulator 10 has a phase shifter circuit 13 and a first CNT circuit 11. The first CNT circuit 11 is connected to the phase shifter circuit 13 to control the output amplitude of the phase shifter circuit 13. The AGC 6 has a second CNT circuit 12 that is connected to an AGC circuit 7 to control the gain of the AGC circuit 7.

A main control signal Vcnt is supplied to each CNT circuit 11, 12. The first CNT circuit 11 generates a shifter gain control signal Vshift for controlling the gain of the phase shifter circuit 13 depending on the main control signal Vcnt. The shifter gain control signal Vshift is sent to the phase shifter circuit 13. The second CNT circuit 12 generates an AGC gain control signal Vagc for controlling the gain of the AGC circuit 7 depending on the main control signal Vcnt. The AGC gain control signal Vagc is sent to the AGC circuit 7.

Figure 6:
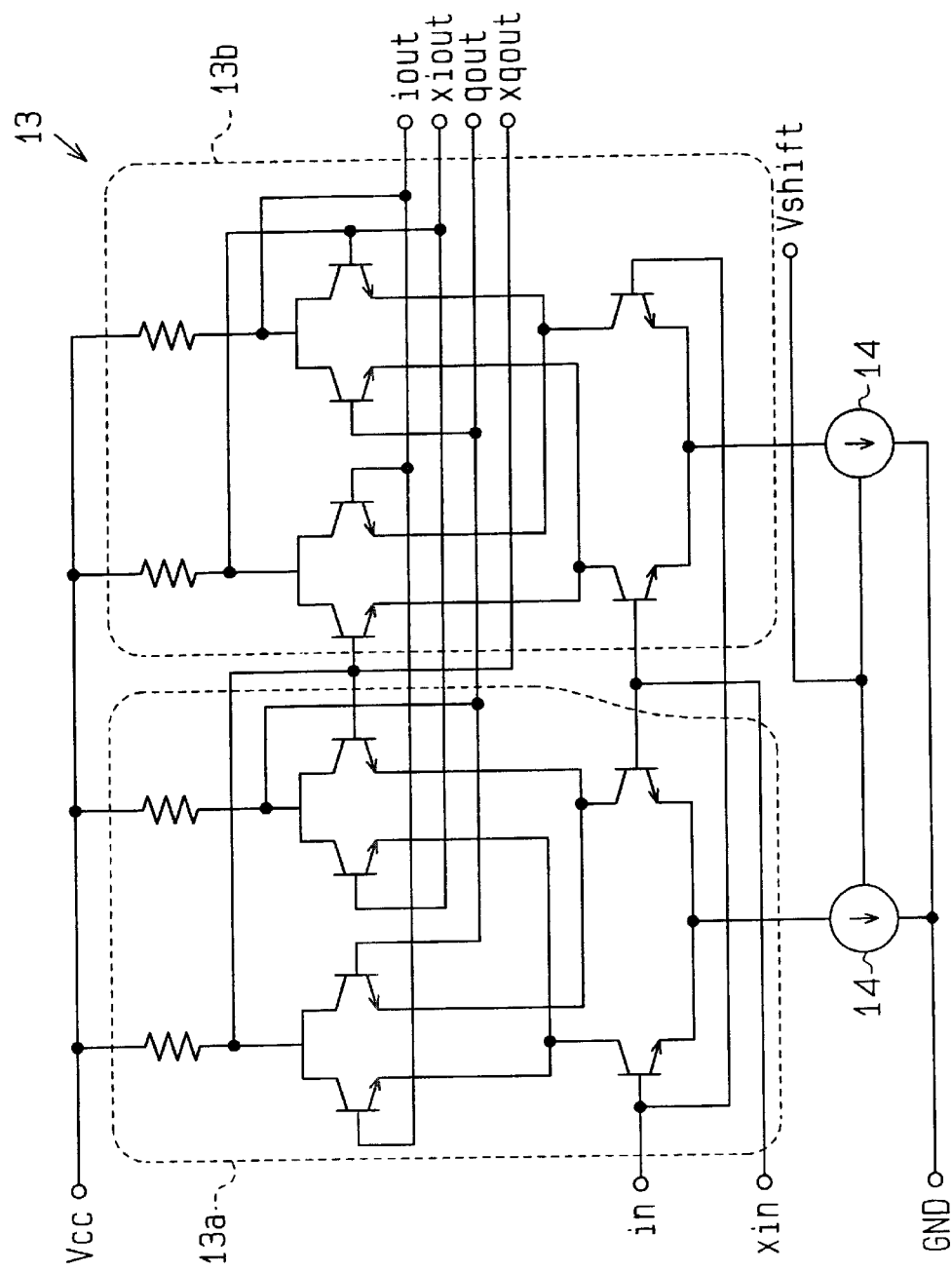
FIG. 6 is a block diagram showing a phase shifter circuit.

The phase shifter circuit 13 will be described with reference to FIG. 6. The phase shifter circuit 13 includes a flip-flop circuit. The flip-flop circuit includes a master-stage latch circuit 13a and a slave-stage latch circuit 13b. Each latch circuit 13a, 13b is connected to a ground GND through an associated current source circuit 14.

The shifter gain control signal Vshift is sent to the current source circuit 14 of each latch circuit. A current generated by each current source circuit 14 is adjusted in accordance with the shifter gain control signal Vshift. Thus, the amplitude of each output signal iout, xiout, qout, and xqout of the phase shifter circuit 13 is controlled depending on the shifter gain control signal Vshift.

Figure 7:
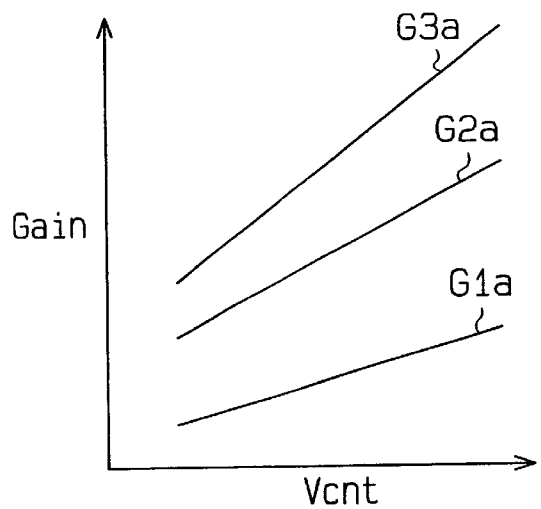
FIG. 7 is a graph indicating the relationship between the gain and a control signal of the semiconductor device of FIG. 5.

As shown in FIG. 7, in the orthogonal modulator 10, the gain G1a of the phase shifter circuit 13 is controlled depending on the main control signal Vcnt. In the AGC 6, the gain G2a of the AGC circuit 7 is controlled depending on the main control signal Vcnt. The total gain G3a of an output signal OUT (an amplified modulation signal) is the addition of the gains G1a, G2a.

The semiconductor integrated circuit device 200 of the second embodiment has the following advantages.

(1) When the output level Pout of the output signal OUT generated by the AGC 6 is adjusted in accordance with the main control signal Vcnt, the gain G2a of the AGC circuit 7 and the gain G1a of the phase shifter circuit 13 are adjusted.

Figure 8:
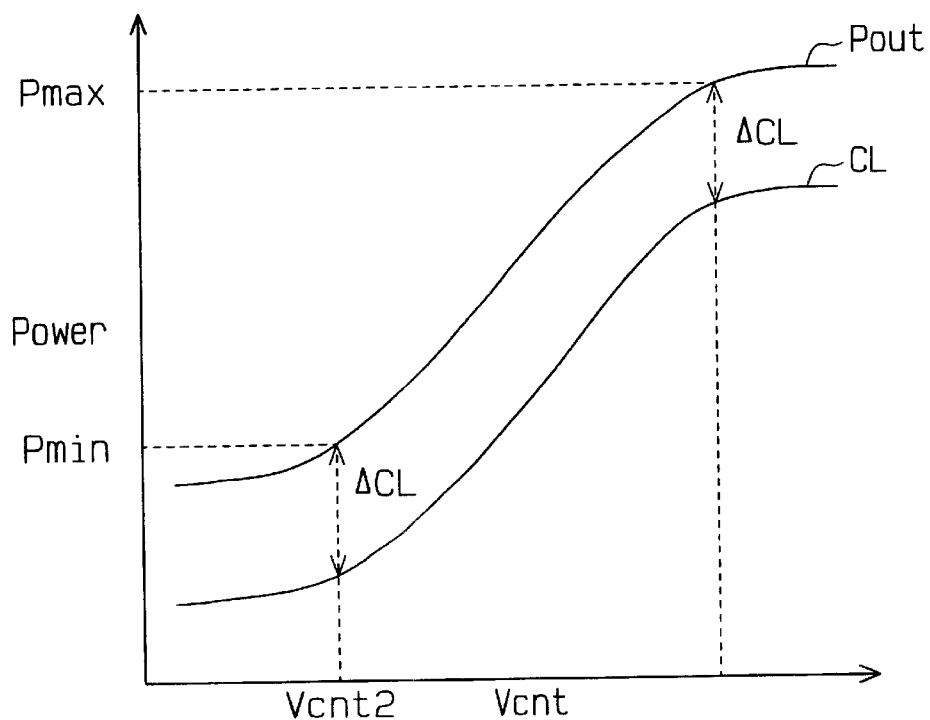
FIG. 8 is a graph indicating the level of a carrier leak and the level of an output signal of the semiconductor device of FIG. 5.

(2) When the output level Pout is attenuated, the gain G2a of the AGC circuit 7 and the gain G1a of the phase shifter circuit 13 are attenuated. Thus, as shown in FIG. 8, as the output level Pout is attenuated toward a minimum value Pmin, the level of the carrier leak CL is attenuated accordingly. As a result, the level difference ΔCL between the output signal OUT and the carrier leak CL is maintained at a substantially constant level.

(3) Since the level difference ΔCL between the output signal OUT and the carrier leak CL remains substantially constant regardless of the attenuation of the output level Pout, the carrier leak characteristics of the semiconductor integrated circuit device 200 are improved.

(Third Embodiment)

Figure 9:
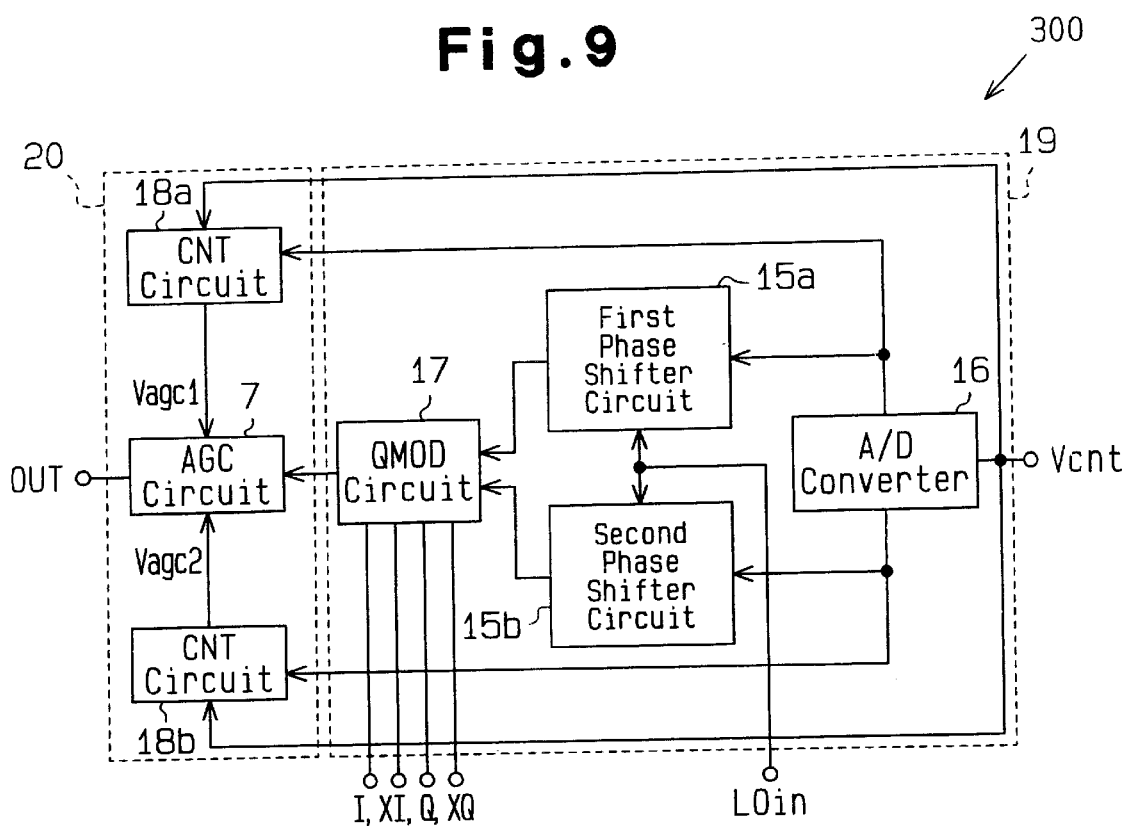
FIG. 9 is a block diagram showing a semiconductor device of a third embodiment according to the present invention.

FIG. 9 shows a semiconductor integrated circuit device 300 of a third embodiment according to the present invention. The device 300 includes an orthogonal modulator 19 and an AGC circuit 20. An input signal LOin is sent to first and second phase shifter circuits 15a, 15b. Each phase shifter circuit 15a, 15b operates in accordance with a different gain. It is preferred that the gain of the first phase shifter circuit 15a is smaller than the gain of the second phase shifter circuit 15b.

A main control signal Vcnt is supplied to an analog/digital converter 16. The horizontal axis of FIG. 10 indicates the level of the main control signal Vcnt. When the level of the main control signal Vcnt is not higher than a predetermined value A of FIG. 10, the analog/digital converter 16 sends a low-level signal to the first and second phase shifter circuits 15a, 15b. If the level of the main control signal Vcnt is higher than the value A, the analog/digital converter 16 sends a high-level signal to the first and second phase shifter circuits 15a, 15b.

More specifically, the first phase shifter circuit 15a is activated in response to the low-level signal of the analog/digital converter 16. The first phase shifter circuit 15a thus sends an output signal to a Quadrature Modulator (QMOD) circuit 17. In contrast, the second phase shifter circuit 15b is activated in response to the high-level signal of the analog/digital converter 16. The second phase shifter circuit 15b thus sends an output signal to the QMOD circuit 17.

The QMOD circuit 17 corresponds to the modulation mixer circuits 3, 4 and the adder 5 of the second embodiment. The QMOD circuit 17 sends an output signal to the AGC circuit 7. The AGC circuit 7 receives first and second AGC gain control signals Vagc1, Vagc2 from a pair of CNT circuits 18a, 18b.

Each CNT circuit 18a, 18b receives an analog control signal Vcnt and an output signal of the analog/digital converter 16 (a digital control signal).

More specifically, the CNT circuit 18a is activated in response to a low-level digital control signal and sends the first AGC gain control signal Vagc1 to the AGC circuit 7. The CNT circuit 18b is activated in response to a high-level digital signal and sends the second AGC gain control signal Vagc2 to the AGC circuit 7.

The gain of the AGC circuit 7 is changed depending on which of the first and second AGC gain control signal Vagc1, Vagc2 the AGC circuit 7 receives. It is preferred that the gain of the AGC circuit 7 corresponding to the first AGC gain control signal Vagc1 is higher that the gain of the AGC circuit 7 corresponding to the second AGC gain control signal Vagc2. It is also preferred that the difference between these gains is equal to the difference between the gains of the first and second phase shifter circuits 15a, 15b.

The operation of the semiconductor integrated circuit device 300 will be described with FIG. 10.

Figure 10:
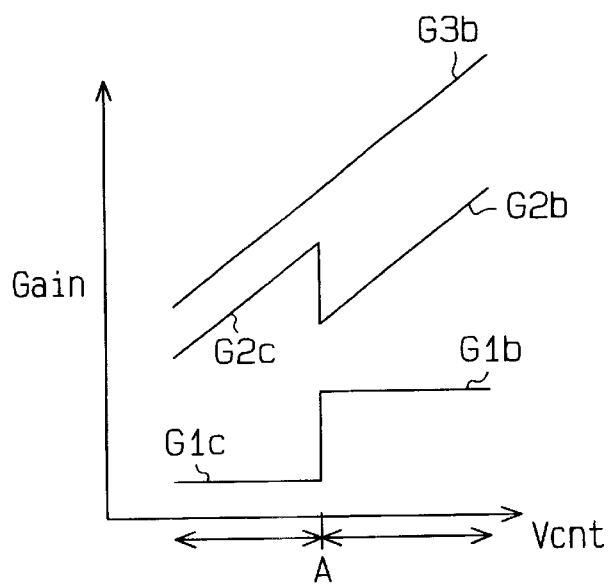
FIG. 10 is a graph indicating the relationship between the gain and a control signal of the semiconductor device of FIG. 9.

When the level of the main control signal Vcnt is higher than a predetermined value A of FIG. 10, the second phase shifter circuit 15b is activated in response to a corresponding digital control signal. The second phase shifter circuit 15b thus operates in accordance with the gain G1b and sends a shifter output signal to the QMOD circuit 17.

Further, the CNT circuit 18b is activated in response to the digital control signal and sends the second AGC gain control signal Vagc2 to the AGC circuit 7. Accordingly, the AGC circuit 7 operates in accordance with the gain G2b. The AGC circuit 7 thus generates an output signal (an amplified modification signal) OUT in correspondence with the total gain G3b, or the addition of the gain G1b of the second phase shifter circuit 15b and the gain G2b of the AGC circuit 7.

In contrast, if the level of the main control signal Vcnt is not higher than the value A, the first phase shifter circuit 15a is activated in response to a corresponding digital control signal. The first phase shifter circuit 15a thus operates in accordance with the gain G1c and sends an output signal to the QMOD circuit 17.

Further, the CNT circuit 18a is activated in response to the digital control signal and sends the first AGC gain control signal Vagc1 to the AGC circuit 7. Accordingly, the AGC circuit 7 operates in accordance with the gain G2c. The AGC circuit 7 thus generates the output signal (the amplified modification signal) OUT in correspondence with the total gain G3b, or the addition of the gain G1c of the first phase shifter circuit 15a and the gain G2c of the AGC circuit 7.

The semiconductor integrated circuit device 300 has the following advantages.

(1) If the level of the main control signal Vcnt is higher than the value A, the second phase shifter circuit 15b operates in accordance with the relatively high gain G1b and the CNT circuit 18b operates in accordance with the relatively low gain G2b. Accordingly, the resulting output signal OUT has a relatively high level.

In contrast, if the level of the main control signal Vcnt is not higher than the value A, the first phase shifter circuit 15a operates in accordance with the relatively low gain G1c and the CNT circuit 18a operates in accordance with the relatively high gain G2c. Accordingly, the resulting output signal OUT has a relatively low level.

That is, when the output level Pout of the output signal OUT is relatively low, the CNT circuit 18a operates to compensate the relatively low gain G1c of the first phase shifter circuit 15a.

(2) When the output level Pout is attenuated, the first phase shifter circuit 15a is activated to reduce the gain of each phase shifter circuit 15a, 15b. Thus, as shown in FIG. 8, as the output level Pout is attenuated toward the minimum value Pmin, the level of the carrier leak CL is attenuated accordingly. Accordingly, the level difference ΔCL between the output signal OUT and the carrier leak CL is maintained at a substantially constant level.

(3) Since the level difference ΔCL between the output signal OUT and the carrier leak CL remains substantially constant regardless of the attenuation of the output level Pout, the carrier leak characteristics of the semiconductor integrated circuit device 300 are improved.

(Fourth Embodiment)

Figure 11:
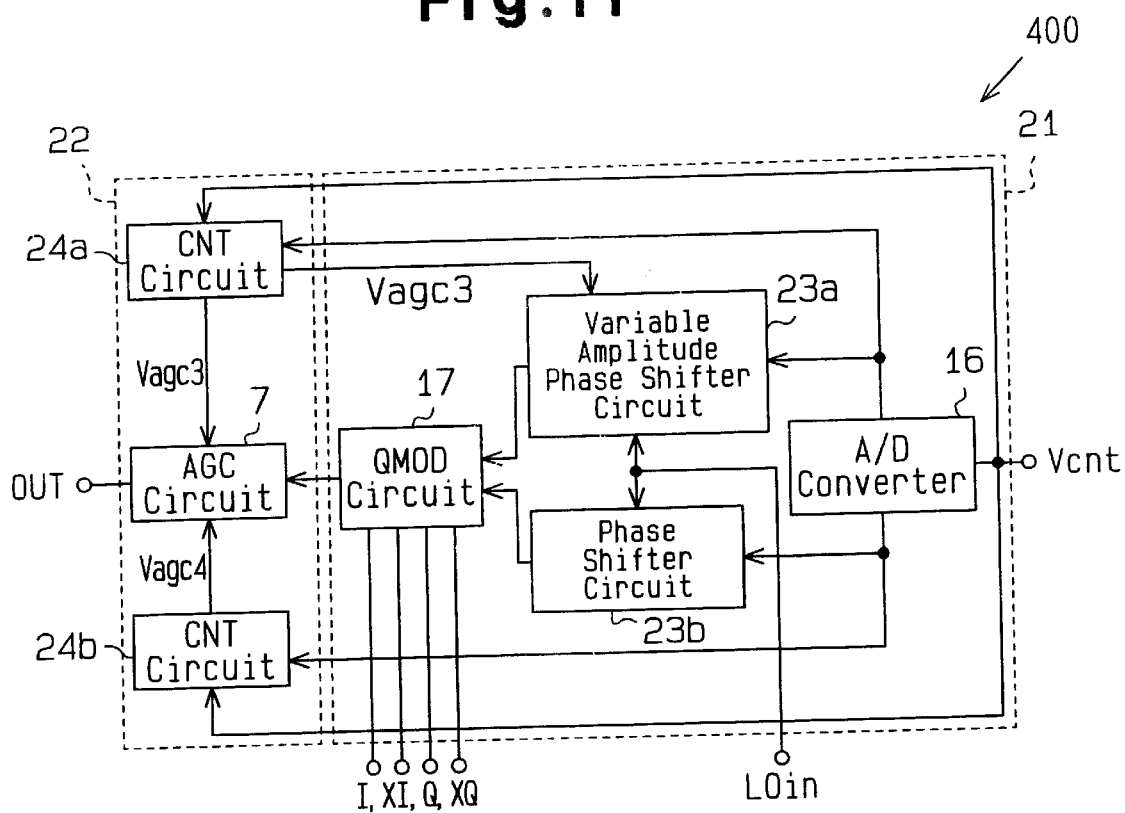
FIG. 11 is a block diagram showing a semiconductor device of a fourth embodiment according to the present invention.

FIG. 11 shows a semiconductor integrated circuit device 400 of a fourth embodiment according to the present invention. The device 400 includes an orthogonal modulator 21 and an AGC circuit 22. An input signal LOin is sent to a pair of phase shifter circuits 23a, 23b. The phase shifter circuit 23a is a variable amplitude type and has an adjustable gain, and the phase shifter circuit 23b has a fixed gain.

A main control signal Vcnt is sent to an analog/digital converter 16. If the level of the main control signal Vcnt is not higher than a predetermined value A of FIG. 12, the analog/digital converter 16 sends a low-level digital control signal to each phase shifter circuit 23a, 23b. If the level of the main control signal Vcnt is higher than the value A, the analog/digital converter 16 sends a high-level digital control signal to each phase shifter circuit 23a, 23b.

More specifically, the phase shifter circuit 23a is activated in response to the low-level digital control signal and sends an output signal to the QMOD circuit 17. In contrast, the phase shifter circuit 23b is activated in response to the high-level digital control signal and sends an output signal to the QMOD circuit 17.

The QMOD circuit 17 corresponds to the modulation mixer circuits 3, 4 and the adder 5 of the second embodiment. The QMOD circuit 17 sends an output signal to the AGC circuit 7. The AGC circuit 7 receives AGC gain control signals Vagc3, Vagc4 from CNT circuits 24a, 24b, respectively. Each CNT circuit 24a, 24b receives the main control signal Vcnt and a digital control signal from the analog/digital converter 16.

More specifically, the CNT circuit 24a is activated in response to a low-level digital control signal and thus sends the AGC gain control signal Vagc3 to the AGC circuit 7 and the phase shifter circuit 23a.

The CNT circuit 24b is activated in response to a high-level digital control signal and thus sends the AGC gain control signal Vagc4 to the AGC circuit 7.

Figure 12:
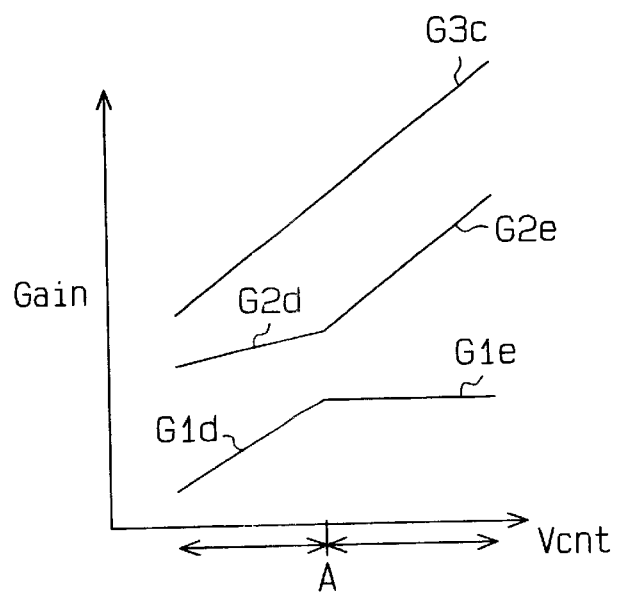
FIG. 12 is a graph indicating the relationship between the gain and a control signal of the semiconductor device of FIG. 11.

As shown in FIG. 12, the AGC circuit 7 operates in accordance with the gains G2d, G2e when receiving the AGC gain control signals Vagc3, Vagc4, respectively. It is preferred that the line that indicates the gain G2e is inclined at a larger gradient than the line that indicates the gain G2d.

The line that indicates the total of the gain G2d of the AGC circuit 7 and the gain G1d of the phase shifter circuit 23a is inclined at a gradient equal to that of the line that indicates the gain G2e of the AGC circuit 7, which corresponds to the AGC gain control signal Vagc4.

The operation of the semiconductor integrated circuit device 400 will be described with reference to FIG. 12.

If the level of the main control signal Vcnt is higher than the value A, the phase shifter circuit 23b is activated in response to a corresponding digital control signal. The phase shifter circuit 23b thus operates in accordance with the fixed gain G1e and sends an output signal to the QMOD circuit 17.

The CNT circuit 24b is activated in response to the digital control signal and sends the AGC gain control signal Vagc4 to the AGC circuit 7. The AGC circuit 7 thus operates in accordance with the gain G2e. Accordingly, the AGC circuit 7 generates an output signal (an amplified modulation signal) OUT in correspondence with the total gain G3c, or the addition of the gain G1e of the phase shifter circuit 23b and the gain G2e of the AGC circuit 7.

In contrast, if the level of the main control signal Vcnt is not higher than the value A, the phase shifter circuit 23a is activated in response to a corresponding digital control signal. The phase shifter circuit 23a operates in accordance with the gain G1d and sends a shifter output signal to the QMOD circuit 17.

The CNT circuit 24a is activated in response to the digital control signal and sends the AGC gain control signal Vagc3 to the AGC circuit 7. The AGC circuit 7 thus operates in accordance with the gain G2d. Accordingly, the AGC circuit 7 generates the output signal (the amplified modulation signal) OUT in correspondence with the total gain G3c, or the addition of the gain G1d of the phase shifter circuit 23a and the gain G2d of the AGC circuit 7.

The semiconductor integrated circuit device 400 has the following advantages.

(1) If the main control signal Vcnt is higher than the value A, the phase shifter circuit 23b, which operates in accordance with the fixed gain G1e, and the CNT circuit 24b are activated. Accordingly, the resulting output signal OUT has a relatively high level.

In contrast, if the main control signal Vcnt is not higher than the value A, the phase shifter circuit 23a and the CNT circuit 24a are activated. Accordingly, the resulting output signal OUT has a relatively low level.

That is, when the output level Pout of the output signal OUT is relatively low, the CNT circuit 24a operates to compensate the gain G1d of the phase shifter circuit 23a, which is relatively low.

(2) If the output level Pout is attenuated, the phase shifter circuit 23a is activated to reduce the gain of each phase shifter circuit 23a, 23b. Thus, as shown in FIG. 8, as the output level Pout is attenuated toward the minimum value Pmin, the level of the carrier leak CL is attenuated accordingly. As a result, the level difference ΔCL between the output signal OUT and the carrier leak CL is maintained at a substantially constant level.

(3) Since the level difference ΔCL between the output signal OUT and the carrier leak CL remains substantially constant regardless of the attenuation of the output level Pout, the carrier leak characteristics of the semiconductor integrated circuit device 400 are improved.

It should be apparent to those skilled in the art that the present invention may be embodied in many other specific forms without departing from the spirit or scope of the invention. Particularly, it should be understood that the invention may be embodied in the following forms.

In the third embodiment, three or more phase shifter circuits that operate in accordance with different gains may replace the phase shifter circuits 15a, 15b. In this case, one of the three phase shifter circuit is selectively activated.

Instead of selecting one from a plurality of phase shifter circuits, a single, variable amplitude type phase shifter circuit may be employed. In this case, the phase shifter circuit adjusts the gain.

The present examples and embodiments are to be considered as illustrative and not restrictive and the invention is not to be limited to the details given herein, but may be modified within the scope and equivalence of the appended claims.

What is claimed is:

1. A semiconductor integrated circuit device, comprising:
   an orthogonal modulator for generating a modulation signal, wherein the orthogonal modulator includes a phase shifter circuit;
   an auto gain controller connected to the orthogonal modulator for amplifying the modulation signal to generate an amplified modulation signal; and
   a gain adjusting circuit for adjusting a gain of the phase shifter circuit in accordance with a main control signal.

2. The semiconductor integrated circuit device as set forth in claim 1, wherein the gain adjusting circuit attenuates the gain of the phase shifter circuit in accordance with attenuation of a level of the amplified modulation signal generated by the auto gain controller.

3. The semiconductor integrated circuit device as set forth in claim 1, wherein the gain adjusting circuit is a first gain adjusting circuit connected to the phase shifter circuit to generate a shifter gain control signal for adjusting the gain of the phase shifter circuit in accordance with the control signal, the semiconductor integrated circuit further comprising:

a second gain adjusting circuit connected to the auto gain controller to generate an AGC control sign al for adjusting the gain of the auto gain controller in accordance with the control signal.

4. The semiconductor integrated circuit device as set forth in claim 1, wherein the phase shifter circuit is one of a plurality of phase shifter circuits that have different gains, and one phase shifter circuit that has a relatively low gain is selectively activated in accordance with attenuation of the amplified modulation signal.

5. The semiconductor integrated circuit device as set forth in claim 4, further comprising an analog/digital converter, which is connected to the plurality of phase shifter circuits, wherein the analog/digital converter converts the control signal to a digital control signal that is sent to the plurality of phase shifter circuits.

6. The semiconductor integrated circuit device as set forth in claim 1, wherein the phase shifter circuit is either a variable amplitude phase shifter circuit that has a variable gain or a fixed amplitude phase shifter circuit that has a fixed gain, and the variable amplitude phase shifter circuit is activated when the level of the amplified modulation signal is attenuated and reduces the gain of the variable amplitude phase shifter circuit in accordance with the control signal.

7. The semiconductor integrated circuit device as set forth in claim 6, further comprising an analog/digital converter, which is connected to the variable amplitude phase shifter circuit and the fixed amplitude phase shifter circuit, wherein the analog/digital converter converts the control signal to a digital control signal that is sent to the variable amplitude phase shifter circuit or the fixed amplitude phase shifter circuit.

8. A semiconductor integrated circuit device, comprising:

a phase shifter circuit for receiving a plurality of complementary input signals that have a predetermined frequency and shifting a phase of each complementary input signal to generate first and second carrier signals;

a first modulation mixer circuit connected to the phase shifter circuit for multiplying the first carrier signal by a first base-band signal to generate a first modulation signal;

a second modulation mixer circuit connected to the phase shifter circuit for multiplying the second carrier signal by a second base-band signal to generate a second modulation signal;

an adder connected to the first and second modulation mixer circuits for adding the first and second modulation signals to generate a sum signal;

a first gain adjusting circuit connected to the phase shifter circuit for controlling the amplitude of each carrier signal of the phase shifter circuit in accordance with a control signal;

an auto gain controller connected to the adder for generating an amplified modulation signal from the sum signal; and a second gain adjusting circuit connected to the auto gain controller for controlling a gain of the auto gain controller in accordance with the control signal.

9. A semiconductor integrated circuit device, comprising:

an analog/digital converter for converting an analog control signal to a digital control signal;

first and second phase shifter circuits connected to the analog/digital converter for receiving the digital control signal and a complementary input signal that has a predetermined frequency, wherein either the first or second phase shifter circuit is activated in response to the digital control signal, the first phase shifter circuit generates a carrier signal in accordance with a relatively small gain when activated, and the second phase shifter circuit generates the carrier signal in accordance with a relatively large gain when activated;

a quadrature modulator connected to the first and second phase shifter circuits for generating a modulation signal from the carrier signal;

an auto gain controller connected to the quadrature modulator for amplifying the modulation signal in accordance with a predetermined gain to generate an amplified modulation signal; and first and second gain adjusting circuits connected to the auto gain controller and the analog/digital converter for receiving the analog control signal and the digital control signal to adjust the gain of the auto gain controller, wherein the first or second gain adjusting circuit is selectively activated in response to the digital control signal, the first gain adjusting circuit is activated together with the first phase shifter circuit to operate the auto gain controller in accordance with a relatively high gain, and the second gain adjusting circuit is activated together with the second phase shifter circuit to operate the auto gain controller in accordance with a relatively low gain.

10. The semiconductor integrated circuit device as set forth in claim 9, wherein the first phase shifter circuit has a first fixed gain, and the second phase shifter circuit has a second fixed gain that is higher than the first fixed gain.

11. The semiconductor integrated circuit device as set forth in claim 9, wherein the first phase shifter circuit has a variable gain, the second phase shifter circuit has a fixed gain, and the first phase shifter circuit lowers a gain of the first phase shifter circuit in accordance with attenuation of the amplified modulation signal of the auto gain controller.

* * * * *